US008609998B2

(12) United States Patent
Miyasaka et al.

(10) Patent No.: US 8,609,998 B2
(45) Date of Patent: Dec. 17, 2013

(54) WIRING BOARD AND METHOD OF MANUFACTURING THE SAME

(75) Inventors: Toshiji Miyasaka, Nagano (JP); Akio Horiuchi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 304 days.

(21) Appl. No.: 12/686,588

(22) Filed: Jan. 13, 2010

(65) Prior Publication Data

US 2010/0175917 A1 Jul. 15, 2010

(30) Foreign Application Priority Data

Jan. 15, 2009 (JP) ................................. 2009-006894

(51) Int. Cl.
  *H05K 1/11* (2006.01)
  *H05K 7/02* (2006.01)
(52) U.S. Cl.
  USPC ........... 174/262; 174/264; 174/266; 361/792; 361/809; 361/810
(58) Field of Classification Search
  USPC .......... 174/255, 261–266; 361/792–796, 807, 361/809, 810
  See application file for complete search history.

(56) References Cited

U.S. PATENT DOCUMENTS

| | | | |
|---|---|---|---|
| 6,392,898 B1 | 5/2002 | Asai et al. | |
| 6,399,897 B1 * | 6/2002 | Umematsu et al. | ........... 174/261 |
| 6,411,519 B2 | 6/2002 | Asai et al. | |
| 6,418,615 B1 | 7/2002 | Rokugawa | |
| 6,441,314 B2 | 8/2002 | Rokugawa | |
| 6,487,088 B2 | 11/2002 | Asai et al. | |
| 6,490,170 B2 | 12/2002 | Asai et al. | |
| 6,931,724 B2 | 8/2005 | Rokugawa | |
| 7,049,701 B2 * | 5/2006 | Usui | .............. 257/773 |
| 7,594,317 B2 | 9/2009 | Nakamura | |
| RE41,051 E | 12/2009 | Asai et al. | |
| RE41,242 E | 4/2010 | Asai et al. | |
| 7,937,828 B2 * | 5/2011 | Yamano | .......................... 29/831 |
| 8,225,502 B2 * | 7/2012 | Kaneko | ............... 29/852 |
| 2001/0054513 A1 | 12/2001 | Asai et al. | |
| 2002/0043727 A1 * | 4/2002 | Wu | ............... 257/786 |
| 2005/0017271 A1 | 1/2005 | Rokugawa | |
| 2007/0132072 A1 * | 6/2007 | Chang | .......................... 257/666 |

FOREIGN PATENT DOCUMENTS

| | | |
|---|---|---|
| JP | 62-10463 | 1/1987 |
| JP | 11-135677 | 5/1999 |
| JP | 2000-013019 | 1/2000 |
| JP | 2000-323613 | 11/2000 |
| JP | 2003-124637 | 4/2003 |
| JP | 2007-158174 A1 | 6/2007 |

OTHER PUBLICATIONS

Notice of Reason for Refusal mailed Dec. 25, 2012 in counterpart Japanese application No. 2009-006894.

* cited by examiner

*Primary Examiner* — Jayprakash N Gandhi
*Assistant Examiner* — Dion Ferguson
(74) *Attorney, Agent, or Firm* — Kratz, Quintos & Hanson, LLP

(57) ABSTRACT

A wiring board (package) has a structure in which multiple wiring layers are stacked one on top of another with insulating layers each interposed between corresponding two of the wiring layers, and the wiring layers are connected to one another through vias formed in each of the insulating layers. In a peripheral region of the package, reinforcing patterns are provided on the same surfaces where the corresponding wiring layers are provided, respectively. Each of the reinforcing patterns is formed of a conductive layer formed on the same surface where the corresponding one of the wiring layers is provided, and is provided in an intermittent ring-like shape when viewed in a planar view.

7 Claims, 8 Drawing Sheets

WIRING BOARD AND METHOD OF MANUFACTURING THE SAME

CROSS-REFERENCE TO RELATED APPLICATIONS

This application is based on and claims priority of Japanese Patent Application No. 2009-006894 filed on Jan. 15, 2009, the entire contents of which are incorporated herein by reference.

BACKGROUND OF THE INVENTION (a) Field of the Invention

The present invention relates to a wiring board for use in packaging an electronic component such as a semiconductor element and a method of manufacturing the same. More specifically, the invention relates to a wiring board having a structure in which multiple wiring layers are stacked one on top of another with an insulating layer interposed therebetween and are interconnected through vias formed in the insulating layers, and a method of manufacturing the same.

The aforementioned wiring board is also referred to as a "semiconductor package" in the following description for the sake of convenience, because the wiring board serves as a package for mounting a semiconductor element or the like thereon.

(b) Description of the Related Art

Heretofore, build-up process has been in wide use as a technology for manufacturing a wiring board of multilayer structure. With the use of the build-up process, the fabrication of a variety of multilayer wiring boards is possible by varying the combination of a material (typically, resin) for an inter-insulating layer and a via hole formation process. A typical manufacturing process for the multilayer wiring board using the build-up process is to stack layers on both or either of surfaces of a core substrate serving as a support base member, by repeating, in turn, formation of an insulating layer, formation of via holes in the insulating layer, and formation of a wiring layer including conductors (vias) filled in the via holes. In such a structure, wiring layers and insulating layers can be thinly formed since the build-up process is used for stacking these layers. However, a portion of the core substrate requires a thickness large enough to afford sufficient wiring board rigidity. This leads to a limitation to making a package thinner as the whole semiconductor package.

Thus, a structure without a core substrate (support base member) has been recently adopted to make a wiring board (semiconductor package) still thinner. The wiring board of such a structure is also called a "coreless board" in that the structure has no "core" portion. Although description is given later for a method of manufacturing such a coreless board, a basic process of the method includes: preparing a temporary substrate as a support; forming, in sequence, a required number of build-up layers (namely, insulating layers including via holes, and wiring layers including the insides (vias) of the via holes) on the temporary substrate; and removing the temporary substrate.

Thus, the process of fabricating a thin board (coreless board) is different form the process of fabricating a conventional thick board (board having a core) in that the support base member is eventually removed or is left as the core. Despite such a difference, the methods of forming wiring layers in these processes are basically the same. Specifically, for the coreless board, the width and pitch of a wiring pattern and the size of a wiring portion (wiring formation region) occupying the wiring board are determined under the same design rule as that for the conventional board, and the wirings are designed based on the same design rule. Thus, the distance from the board edge portion (peripheral edge of the wiring board) to the wiring portion (wiring formation region) is designed in the same manner as that for the conventional board. In the state of the art, the distance (portion where a wiring is not formed) is designed to be approximately 500 μm, for example.

An example of a technology related to the aforementioned prior art is disclosed in Japanese unexamined Patent Publication (JPP) (Kokai) 2000-323613. This publication discloses a technology to obtain a multilayer board for mounting a semiconductor device, in which a mounting surface for mounting the semiconductor device is formed as flat as possible and also as thin as possible. The multilayer board is configured of conductive wirings formed in multiple layers with insulating layers each interposed between corresponding two of the conductive wirings. Here, one surface of the multilayer board is a semiconductor element mounting surface where pads for a semiconductor element are formed, the pads being to be connected to electrode terminals of the semiconductor element to be mounted thereon. The other surface thereof is an external connection terminal bonding surface where pads for external connection terminals are formed. Further, vias electrically connecting the conductive wirings and/or the pads formed on the both surfaces of each of the aforementioned insulating layers are formed while penetrating through the insulating layer. Each of the vias is formed in a circular truncated cone like shape having an opening portion on the external connection terminal bonding surface side of a corresponding one of the insulating layers and also having a bottom surface on an inner surface side of the external connection terminal bonding surface side of the conducive wiring or the pad formed on the semiconductor element mounting surface side. Here, the area of the opening portion is larger than the area of the bottom surface.

Moreover, another example of a technology related to the aforementioned prior art is disclosed in JPP (Kokai) 2007-158174. The technology disclosed in this publication provides a method of manufacturing a coreless board. The method disclosed with individual steps involves: disposing an underlying layer in a wiring formation region on a prepreg; disposing a metal foil on the prepreg via the underlying layer in order that the metal foil larger than the underlying layer can be in contact with an outer periphery of the wiring formation region; and curing the prepreg by applying heat and pressure to the prepreg. Thereby, a temporary substrate is obtained while the metal foil is bonded to the temporary substrate. The method further involves: forming a build-up wiring layer on the metal foil; and delaminating the metal foil from the temporary substrate by cutting a peripheral edge of the underlying layer of the structure. Thereby, a wiring member including the build-up wiring layer formed on the metal foil is obtained.

As described above, the conventional coreless board (semiconductor package) is advantageous in making the board thinner because no core board is required. However, on the contrary, the rigidity of the whole package is low because the package does not include a core board. The structure is thus fragile with respect to an external mechanical stress (shock). Thus, there arises a problem in that an edge portion of a board in particular chips easily.

In other words, when a mechanical stress or shock is externally applied to the board having the structure of the conventional coreless board (semiconductor package), there is a high risk that "chipping" occurs on the edge portion of the board due to the low rigidity of the whole package. In addition, a wiring portion is exposed in some cases depending on the degree of "chipping." Moreover, an outermost insulating layer (solder resist layer) of the package is softer than an insulating layer (build-up layer formed of an epoxy resin or the like) positioned at the inner layer side thereof, so that the outermost insulating layer may be separated from the main body of the substrate (delamination) when a mechanical stress or the like is externally applied thereto.

When the chipping or the like occurs on the board, the board is defective as a product (package). In particular, where a board edge portion chips when some kind of a mechanical stress is externally applied thereto during the manufacturing process, the board becomes a defective product at that stage as a matter of course, and also, the materials, man-hours and the like which have been spent until that stage become waste, hence resulting in a problem that the production yield is lowered.

SUMMARY OF THE INVENTION

An object of the present invention is to provide a wiring board capable of easily implementing a structure in which chipping or the like of the board due to an external mechanical stress or the like does not easily occur, and a method of manufacturing the same.

Another object of the present invention is to provide a method of manufacturing a wiring board capable of easily implementing, without involving an additional manufacturing step, a structure in which chipping or the like does not easily occur, and thereby making a contribution to an improvement in the production yield.

According to one aspect of the invention, there is provided a wiring board including: a structure in which a plurality of wiring layers are stacked one on top of another with insulating layers each interposed between corresponding two of the wiring layers, the wiring layers being connected to one another through a via formed in each of the insulating layers; and a reinforcing pattern provided on a surface where a corresponding one of the wiring layers is provided, in a peripheral region around the structure.

With the structure of the wiring board according to this aspect, the reinforcing pattern is provided in the peripheral region (near the board edge portion) on the same surface where the wiring layer is provided, so that the peripheral portion of the wiring board is reinforced, thereby increasing the rigidity as the whole board. Specifically, the structure becomes resistant against an external mechanical stress or shock. Thus, even when such a stress or the like is applied thereto, occurrence of "chipping" on the board edge portion such as observed in the prior art can be suppressed. Moreover, the structure in which the board edge portion does not easily chip is implemented, so that the possibility of a wiring portion being exposed is lowered.

According to another aspect of the invention, there is provided a method of manufacturing a wiring board, including: forming a resist layer on a support base member, the resist layer being patterned to have an opening portion in accordance with a shape of a pad to be formed in a portion corresponding to a wiring formation region, and to have an opening portion in accordance with a shape of a reinforcing pattern to be formed in a portion corresponding to a peripheral region around the wiring formation region; forming a wiring layer constituting the pad, and a conductive layer constituting the reinforcing pattern, on the support base member exposed through the opening portions of the resist layer, respectively; after removing the resist layer, forming an insulating layer on a surface of the support base member where the wiring layer and the conductive layer are formed; forming a via hole in the insulating layer at a position corresponding to a portion where the wiring layer is formed on the support base member, the via hole extending to the wiring layer; forming a wiring layer on the insulating layer, the wiring layer including a via connected to the wiring layer exposed through the via hole, and forming a conductive layer constituting the reinforcing pattern in a portion corresponding to the peripheral region on the insulating layer; and alternately stacking a required number of insulating layers, wiring layers and conductive layers, and removing the support base member.

With the method of manufacturing a wiring board according to this aspect, the effect (implementation of the structure in which chipping or the like of the board does not easily occur) obtained in the wiring board according to the aforementioned aspect can be easily accomplished without involving any additional manufacturing step. This is because the conventional manufacturing steps can be utilized without any change, and there is no additional burden of cost applicable to the board.

Thereby, even when some kind of a mechanical stress or the like is externally applied to the board during the manufacturing process, because of the presence of the conductive layer (reinforcing pattern) formed near the periphery of the wiring board, the board edge portion or the like can be prevented from chipping. Thus the board does not become a defective product, and the production yield can be improved.

With reference to the accompanying drawings, descriptions are given, using embodiments of the present invention to be described hereinafter, of other constructional features and advantages and the like based thereon of the wiring board and the method of manufacturing the same according to the present invention.

DESCRIPTION OF THE PREFERRED EMBODIMENTS

Hereinafter, descriptions are given of preferred embodiments of the present invention with reference to the accompanying drawings.

Figure 1:
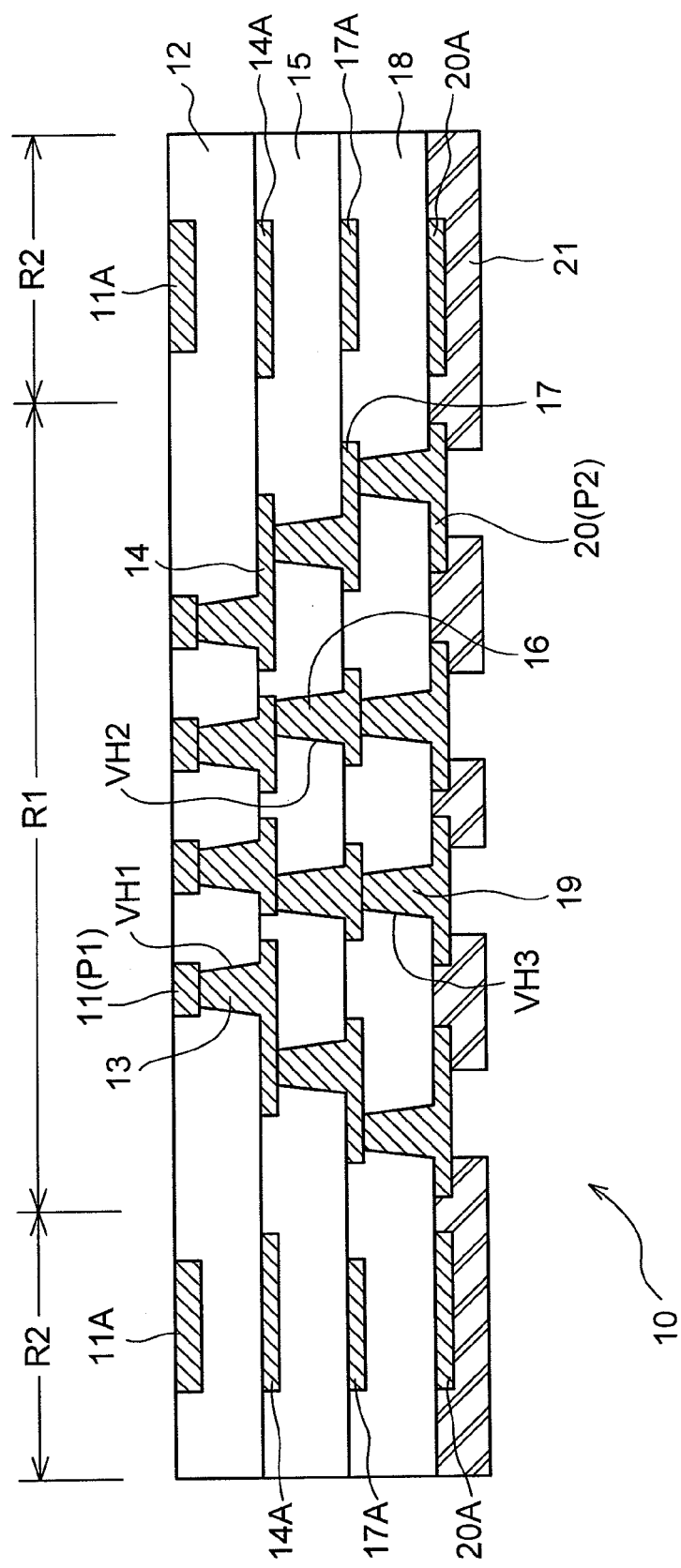
FIG. 1 is a cross-sectional view showing a configuration of a wiring board (semiconductor package) according to an embodiment of the present invention.
Figure 2:
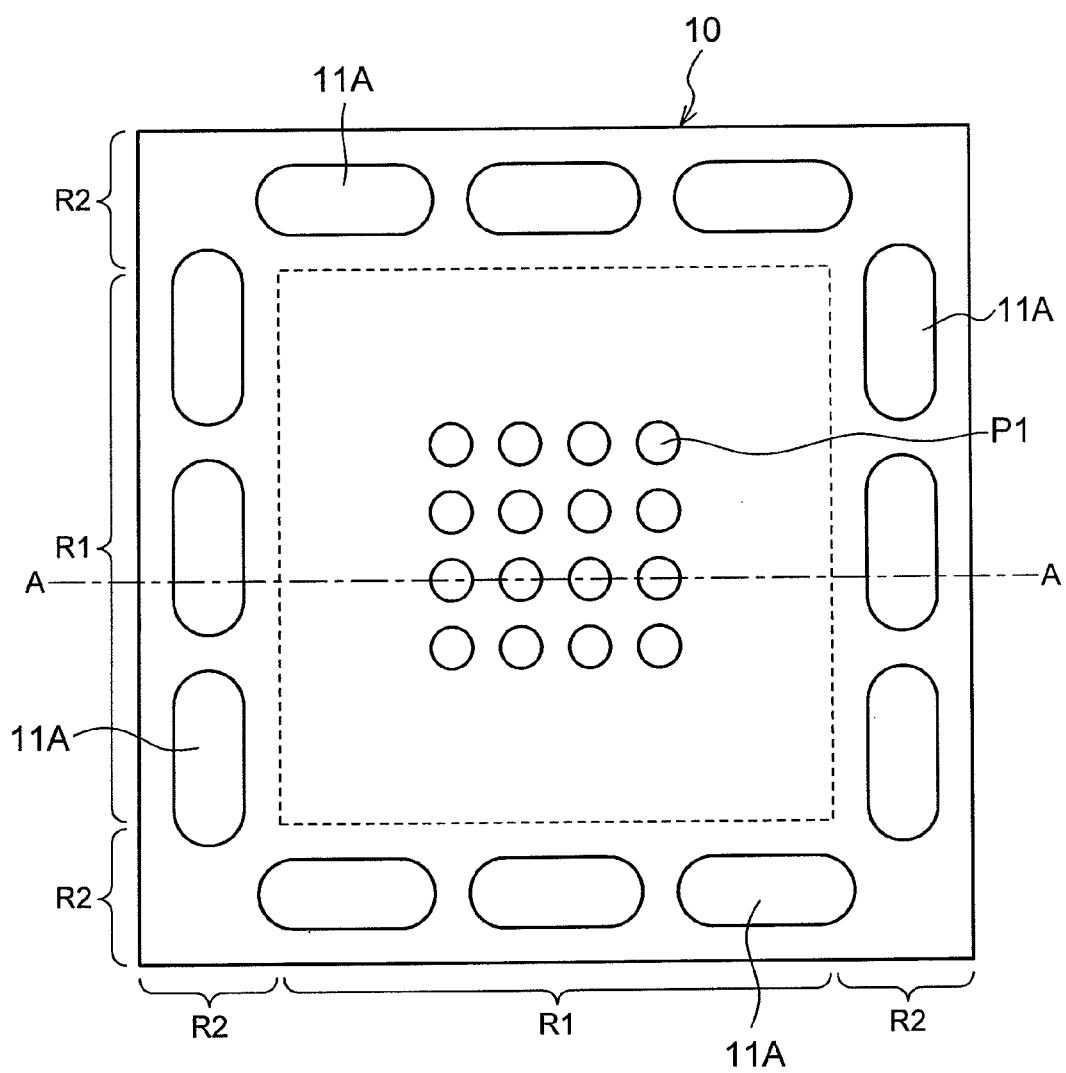
FIG. 2 is a schematic plan view of the wiring board of FIG. 1 when viewed from a chip mounting surface side.

FIG. 1 shows a configuration of a wiring board (semiconductor package) 10 according to an embodiment of the present invention, in a cross-sectional view. FIG. 2 schematically shows in plan view, the configuration of the wiring board 10 when the wiring board 10 is viewed from an upper side (side on which an electronic component (chip) such as a semiconductor element is mounted) thereof. The cross-sectional view of FIG. 1 shows the configuration of the wiring board 10 as viewed in cross-sectional view along the line A-A in the plan view of FIG. 2.

The wiring board (semiconductor package) 10 according to the present embodiment has a structure in which multiple wiring layers 11, 14, 17 and 20 are stacked one on top of another with insulating layers (specifically, resin layers) 12, 15 and 18 each interposed between corresponding two of the wiring layers, as illustrated in FIG. 1. In this structure, the wiring layers 11, 14, 17 and 20 are interconnected via conductors (vias 13, 16 and 19) filled into via holes VH1, VH2 and VH3 formed in the insulating layers 12, 15 and 18, respectively. Specifically, the package 10 has the form of a "coreless board," which does not include a support base member. The package 10 is thus different from a wiring board fabricated using a general build-up process (in which a required number of build-up layers are sequentially formed and stacked on both or either of surfaces of a core substrate serving as a support base member).

As shown in FIG. 2, the coreless board has a wiring formation region R1 (portion surrounded by a broken line) defined in a portion corresponding to a region where a chip is mounted. The coreless board also has a peripheral region R2 around the wiring formation region R1. In this embodiment, the wiring formation region R1 is formed in a rectangle with a side length of approximately 20 to 40 mm (for example, 30 mm×30 mm). The width of the peripheral region R2 is selected to be approximately 500 to 1000 μm. The thickness of the substrate is selected to be approximately 0.1 to 0.5 mm.

On the resin layer 12 positioned outermost on one surface side (upper side in the example shown in FIG. 1) of the coreless board, pads P1 (portions each defined at a required position of the wiring layer 11) are arranged in a chip mounting area (wiring formation region R1). In the example shown in FIG. 2, sixteen pads P1 are arranged. The pads P1 are provided so as to be exposed and flush with a surface of the package 10 as shown in FIG. 1. Electrode pads of an electronic component (chip) such as a semiconductor element to be mounted on the package 10 are flip-chip connected to the pads P1 via conductive materials such as solder bumps, respectively.

Meanwhile, on a surface opposite to the surface where the pads P1 are formed (lower side in the example shown in FIG. 1), a solder resist layer (insulating layer) 21 functioning as a protection film is formed to cover a surface of an outermost wiring layer (wiring layer 20 in the illustrated example) while exposing the portions of pads P2 each defined at a required position of the outermost wiring layer. The pads P2 are connected to the pads P1 in the chip mounting area through the vias 19, the wiring layer 17, the vias 16, the wiring layer 14 and the vias 13, respectively. To the pads P2 exposed from the solder resist layer 21, external connection terminals such as solder balls or pins for use in packaging of the package 10 on a packaging substrate such as a motherboard are bonded, respectively. Alternatively, instead of bonding solder balls or the like thereto, the pads P2 alone can be used as the external connection terminals.

Specifically, in the present embodiment, the surface where the solder resist layer 21 is formed is used as an "external connection terminal bonding surface," and another surface (surface where the pads P1 are exposed and flush with the surface of the package 10) opposite to this surface is used as a "chip mounting surface." However, depending on a use environment such as use conditions or an arrangement form of the package 10, the package 10 can be used in a form in which the chip mounting surface and the external connection terminal bonding surface are upside down.

Moreover, reinforcing patterns 11A, 14A, 17A and 20A, which characterize the present invention, are provided at portions (peripheral regions R2) where the wirings of the package 10 are not provided, respectively. Each of the reinforcing patterns is configured of a conductive layer (made of the same material as that of a corresponding one of the wiring layers) formed simultaneously when a corresponding one of the wiring layers 11, 14, 17 and 20 is formed in the process of fabricating the package 10 as described later. Among the reinforcing patterns, the reinforcing pattern 11A corresponding to the uppermost wiring layer 11 (pads P1) is provided in an intermittent ring-like shape in a planar view as exemplified in FIG. 2. In the illustrated example, three pieces of the reinforcing pattern 11A are formed on each side of the package 10, i.e., the reinforcing pattern 11A separated into a total of 12 pieces is formed. The reinforcing patterns 14A, 17A and 20A corresponding to the other wiring layers 14, 17 and 20 are provided in the same layouts as that of the reinforcing pattern 11A of the uppermost layer, respectively.

The reason for intermittently providing each of the reinforcing patterns 11A, 14A, 17A and 20A as described above is as follows. Specifically, if a reinforcing pattern is formed in a continuous ring-like pattern, due to a difference between the thermal expansion coefficients of the reinforcing pattern (conductive layer) and the resin portion therearound, a stress occurs in a specific direction (direction orthogonal to the boundary surface between the patterned portion and the resin portion). Thus, there is a high possibility that the board deforms along the direction. In particular, if the board remains deformed in a state where the size of the deformation exceeds a certain limitation for a certain period of time, the deformed state (partial warpage) of the board may remain unchanged. In this respect, the reinforcing pattern is provided intermittently as illustrated in order to disperse the stress in multiple directions, the stress occurring due to the difference between the thermal expansion coefficients. Thereby the possibility of the occurrence of the deformation of the board is reduced.

Moreover, the individual patterns constituting the intermittently-formed reinforcing patterns 11A, 14A, 17A and 20A are formed in a shape not having a corner portion when viewed in plan. For example, where the individual reinforcing pattern is formed in a simple rectangle shape, the stress occurring due to the difference between the thermal expansion coefficients of the reinforcing pattern and the resin portion concentrates on the corner portions of the rectangle. This may lead to the occurrence of deformation of the board, cracks or delamination. Such a disadvantage can be avoided by rounding the corner portions of the rectangle (i.e., by providing curved portions).

In the present embodiment, the individual reinforcing pattern (11A, 14A, 17A, 20A) is formed in such a manner that it has a rectangle shape of which the long sides are parallel to the corresponding side of the wiring board 10, and that the short side portions of the rectangle are formed in a spherical shape. It is of course that the form of the individual pattern is not limited to the illustrated example.

For example, the individual reinforcing pattern may be formed in such a manner that it has a rectangle shape of which the long sides are parallel to the corresponding side of the wiring board 10, and that the corner portions of the rectangle are formed in a curved shape. Alternatively, the individual reinforcing pattern may be formed in an ellipse shape of which the major axis is parallel to the corresponding side of the wiring board 10.

Although the reinforcing patterns 11A, 14A, 17A and 20A are provided to the wiring layers 11, 14, 17 and 20, respectively, in a corresponding manner, the reinforcing patterns are not necessarily provided to the respective wiring layers in a corresponding manner. A reinforcing pattern may be omitted for some of the wiring layers. For example, only the reinforcing patterns 11A and 20A may be formed with the wiring layers 11 and 20, the wiring layers 11 and 20 being the outermost layers of the package 10. Then, the reinforcing patterns 14A and 17A may be omitted while only the wiring layers 14 and 17 are formed in this case.

Moreover, the reinforcing patterns 11A, 14A, 17A and 20A are essential constituent elements for achieving the desired objects of the present invention, so that, in considering the function of the reinforcing patterns, each of the reinforcing patterns is preferably extended to the board edge portion (peripheral edge of the package 10). However, in this case, if the side surface of the reinforcing pattern (conductive layer) is exposed, the portion of the side surface may be oxidized, and then corroded in some cases, hence causing some kind of negative influence. Accordingly, even when the reinforcing pattern is extended, the side surface of the reinforcing pattern needs to be formed in an unexposed manner. Note that, a surface of the reinforcing pattern 11A of the uppermost layer is exposed from the surface of the package 10; however, the inconvenience such as oxidation, corrosion or the like does not occur because the surface of the reinforcing pattern 11A is coated by a gold (Au) plating layer as described later.

Meanwhile, the package 10 is not initially fabricated as a single unit. For the purpose of improving the productivity, each package 10 is obtained by eventually cutting and dividing a multi-unit substrate into package units, the multi-unit substrate including multiple wiring boards fabricated therein. For this reason, a space, to which a margin (cutting accuracy of approximately ±50 μm) for cutting is added, is needed around each package eventually to be cut and divided.

For example, when the distance from the board edge portion to the wiring portion (wiring formation region R1) is designed to be approximately 500 μm, each of the reinforcing patterns 11A, 14A, 17A and 20A is formed within the area of approximately 500 μm. In this case, it is sufficient if the distance from the board edge portion to the side surface of the reinforcing pattern is selected to be approximately 250 μm, in order to securely allow the side surface of the reinforcing pattern not to be exposed in consideration of the cutting accuracy (approximately ±50 μm).

Descriptions of a specific material, size, thickness and the like of each component forming the package 10 are provided in relation to a process to be described hereinafter.

Next, a description is given of a method of manufacturing the wiring board (semiconductor package) 10 according to the present embodiment with reference to FIGS. 3A to 4C showing an example of a manufacturing process.

Figure 3A:
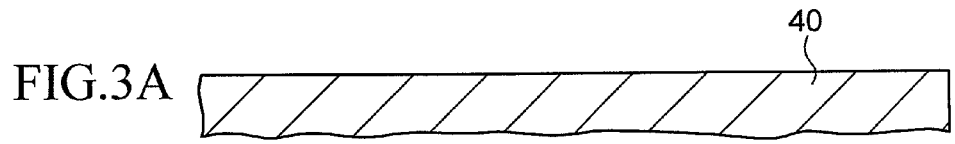
FIGS. 3A to 3F are cross-sectional views showing steps of a method of manufacturing the wiring board of FIG. 1.
Figure 3B:
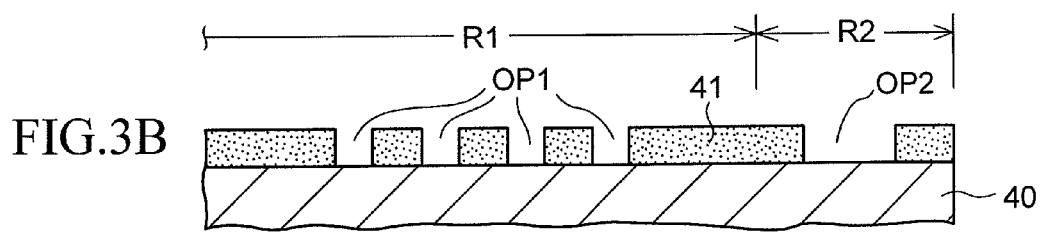
Figure 3C:
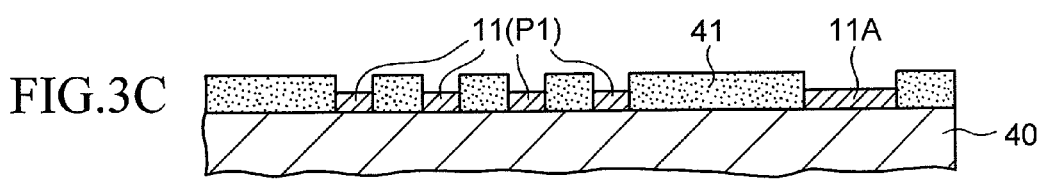
Figure 3D:
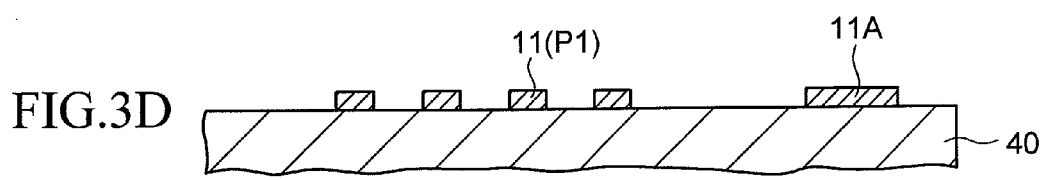
Figure 3E:
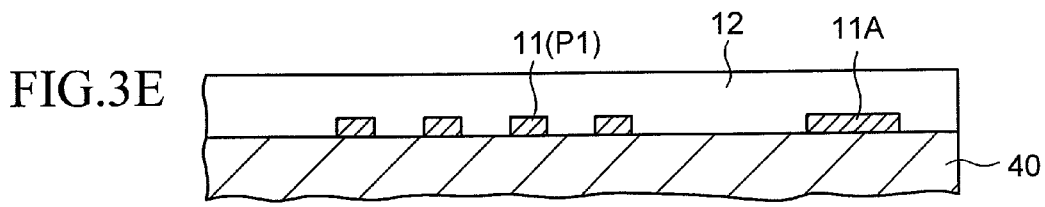
Figure 3F:
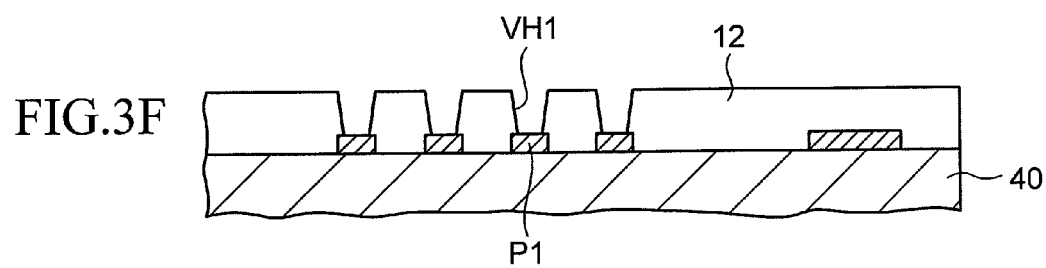
Figure 4A:
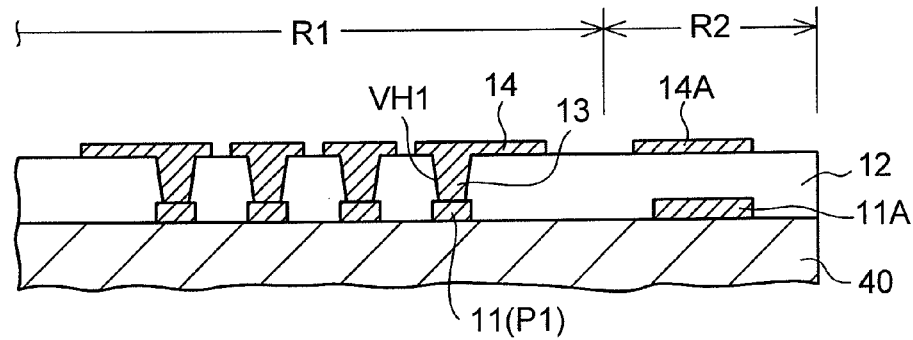
FIGS. 4A to 4C are cross-sectional views showing manufacturing steps subsequent to the steps in FIGS. 3A to 3F.
Figure 4B:
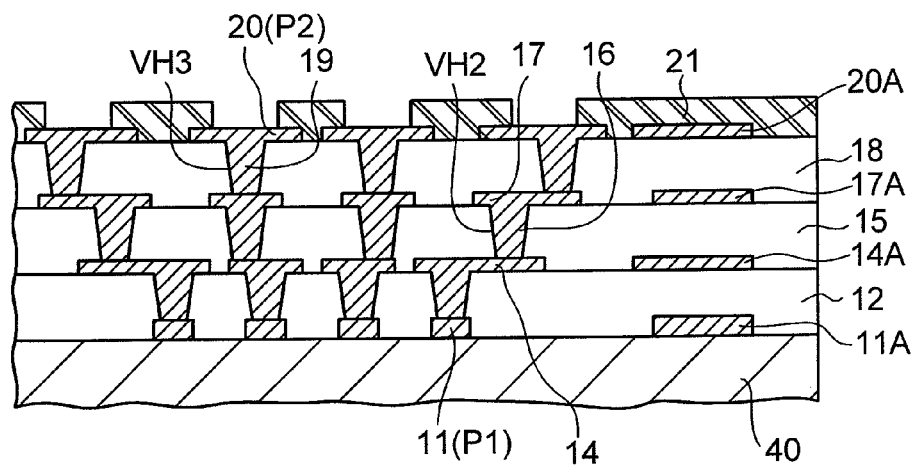
Figure 4C:
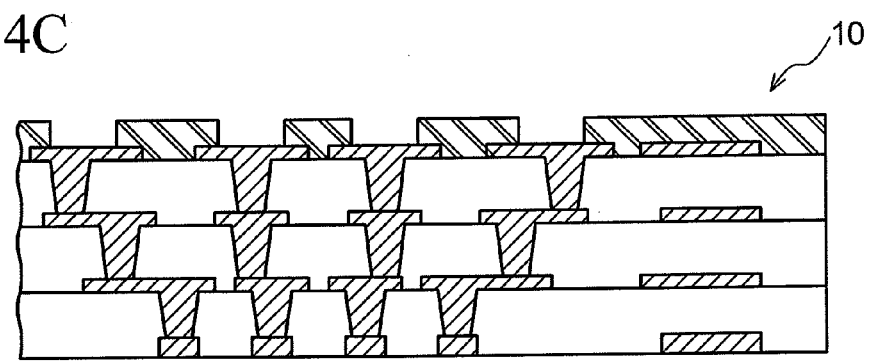

First, a support base member 40 is prepared as a temporary substrate in the initial step (see FIG. 3A). As a material for the support base member 40, a metal (copper (Cu), for example) soluble in an etchant is used in considering that the material is eventually etched away as described later. Moreover, a metal plate or a metal foil is basically sufficient for use as a form of the support base member 40. However, as a specific example, the support base member 40 may be used in such a form as is disclosed in JPP (Kokai) 2007-158174, "method of manufacturing wiring board and method of manufacturing electronic component mounting structure," previously proposed by the present applicant. Specifically, a structure formed by disposing an underlying layer and a copper foil on a prepreg (e.g., a bonding sheet in a semicured B stage, formed by impregnating a thermosetting resin such as an epoxy-base resin or a polyimide-base resin into glass cloth which is a reinforcing material) and then by applying heat and pressure to the prepreg may be preferably used as the support base member 40.

In the next step (see FIG. 3B), a plating resist is formed on the support base member 40 by using a patterning material. Then, a resist layer 41 is formed in a required shape by patterning. The resist layer 41 is patterned to have opening portions OP1 according to the shape of the pads P1 to be formed in a portion corresponding to the wiring formation region R1, and opening portions OP2 according to the shape (see FIG. 2) of the reinforcing pattern 11A to be formed in a portion corresponding to the peripheral region R2.

A photosensitive dry film (a structure in which a resist material is held between a polyester cover sheet and a polyethylene separator sheet) or a liquid photoresist (liquid resist such as a novolak-base resin or an epoxy-base resin) can be used as the patterning material. For example, when a dry film is used, a surface of the support base member 40 is cleaned, and thereafter, a dry film is laminated on the surface by thermal compression bonding. The dry film is then cured by subjecting the dry film to exposure under ultraviolet (UV) irradiation by use of a mask (not illustrated) formed in a required shape by patterning. Furthermore, the corresponding portions (opening portions OP1 and OP2) are etched away by use of a predetermined developing solution. The resist layer 41 according to the required pattern is thus formed. The resist layer 41 can be also formed through the same steps even when the liquid photoresist is used.

In the next step (see FIG. 3C), the wiring layer 11 and the conductive layer 11A corresponding to the opening portions OP1 and OP2, respectively, are formed on the support base member (Cu) 40 by electrolytic plating using the support base member 40 as a power feeding layer, the support base member 40 being exposed through the opening portions OP1 and OP2 of the plating resist 41. The wiring layer 11 functions as the pads P1 for use in mounting of an electronic component (chip) such as a semiconductor element. In addition, the conductive layer 11A constitutes the reinforcing pattern characterizing the present invention and is not connected to any of the wiring layers.

As the material forming the wiring layer 11 and the conductive layer 11A, a metal species insoluble in an etchant is selected in considering that the support base member 40 in contact therewith is eventually etched away. In the present embodiment, since copper (Cu) is used as the material for the support base member 40, gold (Au) is used, to perform plating, as a metal different from copper, in considering that gold can ensure good conductivity. Furthermore, nickel (Ni) plating is performed on the Au plated layer. Alternatively, copper (Cu) plating may be further performed on the Ni plated layer. The reason for having such a plating layer structure is for enhancing adhesion when the wiring layer is connected to the pads P1 through the vias of copper (Cu) in a later step, and also for preventing Cu from diffusing into the Au plating layer. In other words, in this step, the pads P1 and the reinforcing pattern 11A formed of a two-layer structure of the Au plated layer and the Ni plated layer (or three-layer structure of the Au plated layer, the Ni plated layer and the Cu plated layer) are formed.

In the next step (see FIG. 3D), the resist layer 41 used as the plating resist is removed. For example, when a dry film is used as the plating resist, an alkaline chemical liquid such as sodium hydroxide or a monoethanolamine-base liquid can be used for removal. Further, when a liquid resist such as a novolak-base resin or an epoxy-base resin is used as the plating resist, acetone, alcohol or the like can be used for removal. In this manner, a structure in which the wiring layer 11 (pads P1) and the conductive layer (reinforcing pattern) 11A are formed on the support base member 40 as illustrated is fabricated.

In the next step (see FIG. 3E), the insulating layer 12 formed on the surface of the support base member 40 where the wiring layer 11 and the conductive layer 11A are formed. An epoxy-base resin, a polyimide-base resin or the like may be used as the material for the insulating layer 12. As a method of forming the insulating layer 12, for example, an epoxy-base resin film is laminated on the support base member 40, the wiring layer 11 and the conductive layer 11A. Then, the resin film is cured by heat processing at a temperature of 130 to 150° C. while the resin film is pressed. Thereby, the resin layer (insulating layer 12) can be formed.

In the next step (see FIG. 3F), the via holes VH1 extending to the pads P1, respectively, are formed by a hole making process with a carbon dioxide laser, an excimer laser or the like at required positions (portions corresponding to the pads P1 formed on the support base member 40) of the insulating layer 12. Note that, although a laser or the like is used to form the via holes VH1 in this step, photolithography can be also used to form the required via holes when the insulating layer 12 is formed by use of a photosensitive resin.

In the next step (see FIG. 4A), the wiring layer 14 having a required pattern and connected to the via holes VH1 is formed on the insulating layer 12, having the via holes VH1 formed thereon, by filling in the via holes VH1. At this time, the conductive layer 14A constituting a reinforcing pattern is formed as well. The wiring layer 14 and the conductive layer 14A formed at portions corresponding to the wiring formation region R1 and the peripheral region R2 around the wiring formation region R1, respectively. A semi-additive process is used for the formation of the wiring layer 14 and the conductive layer 14A, for example.

Specifically, a copper (Cu) seed layer (not illustrated) is formed on the insulating layer 12 and also in the via holes VH1 by electroless plating, sputtering or the like, first. Then, a resist film (not illustrated) is formed, which includes opening portions according to the shapes of the wiring layer 14 and the conductive layer 14A to be formed, respectively. Next, a conductive (Cu) pattern (not illustrated) is formed on the seed layer (Cu) by electrolytic Cu plating using the seed layer as a power feeding layer, the seed (Cu) layer being exposed through the opening portions of the resist film. Furthermore, the seed layer is etched by using the conductive (Cu) pattern as the mask after the resist film is removed. Thereby, the required wiring layer 14 and the conductive layer 14A are obtained.

Note that, other than the semi-additive process, various wiring formation methods including a subtractive process and the like can be used.

In the next step (see FIG. 4B), the insulating layers and the wiring layers/conductive layers are alternately stacked in the same manner as the process performed in the steps in FIGS. 3E to 4A. In the illustrated example, two insulating layers and two wiring layers/conductive layers are stacked for the simplicity of description. Specifically, a resin layer (insulating layer 15) is formed on the insulating layer 12 and the wiring layer 14/conductive layer 14A. Then, the via holes VH2, which extend to the pads (not illustrated) of the wiring layer 14, respectively, are formed on the insulating layer 15. Thereafter, the wiring layer 17 having a required pattern and connected to the pads is formed by filling in these via holes VH2 (formation of the vias 16). At this time, the conductive layer 17A constituting a reinforcing pattern is also formed. Furthermore, a resin layer (insulating layer 18) is formed on the insulating layer 15 and the wiring layer 17/conductive layer 17A. Then, the via holes VH3, which extend to the pads (not illustrated) of the wiring layer 17, respectively, are formed on the insulating layer 18. Thereafter, the wiring layer 20 having a required pattern and connected to the pads is formed by filling in these via holes VH3 (formation of the vias 19). At this time, the conductive layer 20A constituting the reinforcing pattern is also formed. The wiring layer 20 constitutes the outermost wiring layer in the present embodiment.

Moreover, the solder resist layer 21 is formed so as to cover the surface (insulating layer 18 and the wiring layer 20/conductive layer 20A) while exposing the portions of the pads P2 each defined at a corresponding one of the required positions of the wiring layer 20. The solder resist layer 21 can be formed, for example, by laminating a photosensitive solder resist film or applying a liquid solder resist onto the surface, and then by patterning the resist in a required shape. In this manner, the pads P2 are exposed through the opening portions of the solder resist layer 21.

To these pads P2, external connection terminals such as solder balls or pins for use in packaging of the package 10 on a motherboard or the like are bonded. Thus, gold (Au) plating is preferably performed on the pads P2 in order to improve contact characteristics. At this time, Ni plating is performed first on the pads (Cu) P2, and thereafter, Au plating is performed thereon. Specifically, a conductive layer (not illustrated) having a two-layer structure of the Ni plated layer and the Au plated layer is formed on each of the pads P2.

In the final step (see FIG. 4C), the support base member 40 (FIG. 4B) used as the temporary substrate is removed. For example, the support base member 40 can be selectively etched away by wet etching using a ferric chloride aqueous solution, a copper chloride aqueous solution, an ammonium persulfate aqueous solution or the like with respect to the exposed pads P1 and P2 (Au plating layer is formed on the surface layer portion of each of the pads), the resin layer 12 and the solder resist layer 21.

The wiring board 10 (FIG. 1) of the present embodiment is fabricated through the steps described above.

As described above, with the wiring board (semiconductor package) 10 according to the present embodiment and the method of manufacturing the same (FIGS. 1 to 4C), each of the reinforcing patterns 11A, 14A, 17A and 20A is formed at the portion near the board edge portion in the peripheral region R2 (portion where a corresponding one of the wirings is not formed) of the package 10. Thus, the structure in which the peripheral portion of the package 10 is reinforced, i.e., the structure resistant against an external mechanical stress, shock or the like is obtained. In other words, the rigidity as the whole package is increased, so that an occurrence of "chipping" of the board edge portion observed in the prior art can be effectively suppressed even when a mechanical stress or the like is externally applied to the package. In addition, since the structure in which the edge portion of the package 10 does not easily chip is implemented, a possibility that the portions of the wiring layers 14, 17 and 20 are exposed is also low.

The reinforcing patterns 11A, 14A, 17A and 20A for preventing chipping as described above can be designed by extending a portion of a wiring layer allocated as a power supply layer or a ground layer (plane layer formed in "solid state" in many cases), for example, so that the reinforcing pattern can be easily designed. Thereby, the structure in which chipping or the like of the board due to an external mechanical stress or the like does not easily occur can be easily implemented.

In addition, in the process of the present embodiment, the manufacturing steps (FIGS. 3A to 4C) of the conventional coreless board can be utilized without any change for the formation of the reinforcing patterns 11A, 14A, 17A and 20A, so that there is no additional burden of cost applicable to the board. Specifically, without involving any additional manufacturing step, the package structure in which chipping or the like of the board due to an external mechanical stress or the like does not easily occur can be easily implemented.

Accordingly, even when some kind of a mechanical stress or the like is externally applied to the board during the process, chipping of the board edge portion or the like can be prevented because of the presence of the reinforcing patterns 11A, 14A, 17A and 20A provided near the periphery of the package 10. Thus, the board does not become a defective product, and the production yield can be improved.

Figure 5:
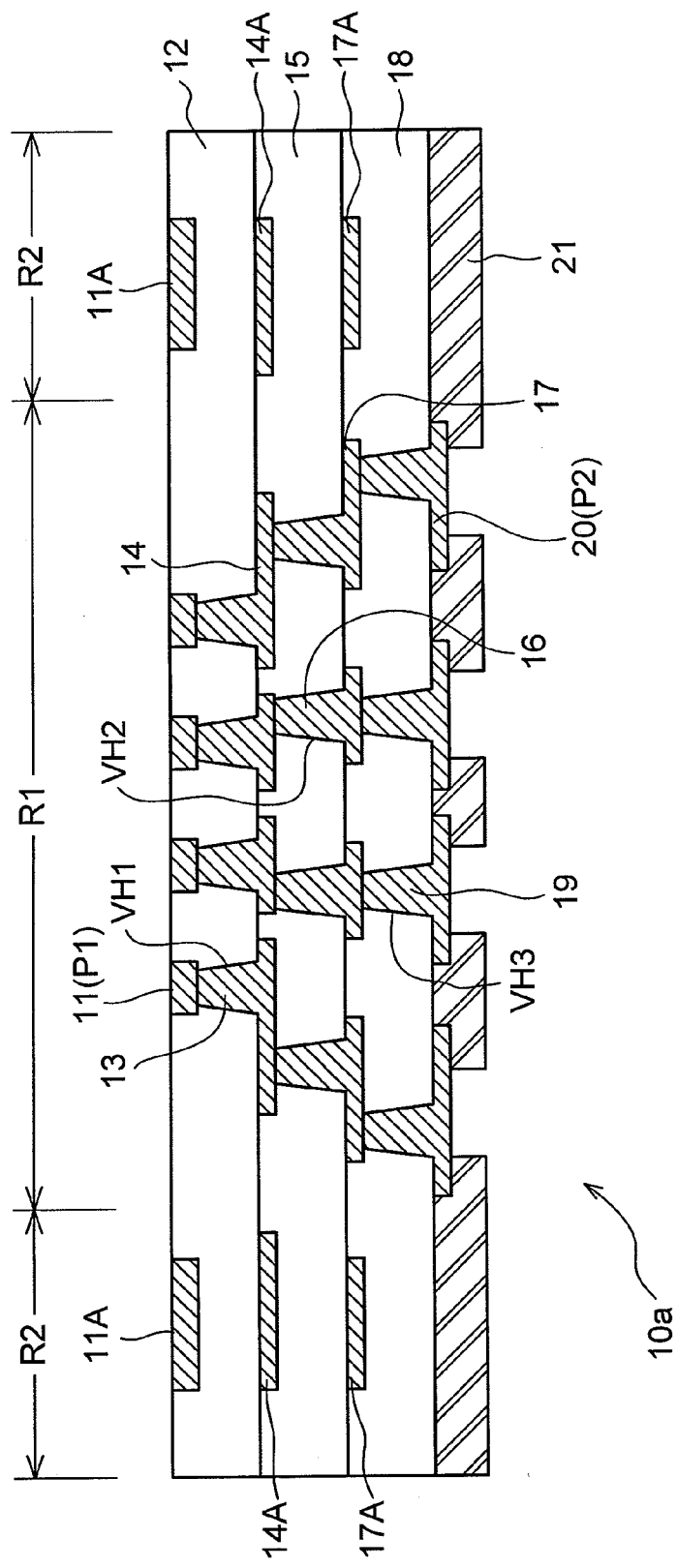
FIG. 5 is a cross-sectional view showing a configuration of a wiring board according to a modification of the embodiment of FIG. 1.

The configuration of the wiring board (semiconductor package) 10 according to the aforementioned embodiment has been described taking an instance where the reinforcing patterns (the conductive layers 11A, 14A, 17A and 20A) are embedded in all of the insulating layers 12, 15 and 18 as well as the solder resist layer 21 (insulating layer), respectively. However, as is apparent from the gist (provision of the reinforcing pattern at the portion near the edge portion of the wiring board) of the present invention, the reinforcing pattern does not have to be necessarily provided in each of the insulating layers. FIG. 5 shows an example of this case (a modification of the embodiment of FIG. 1).

In comparison with the configuration of the wiring board 10 of FIG. 1, a wiring board (semiconductor package) 10a according to an embodiment shown in FIG. 5 is different in that the reinforcing pattern 20A (see FIG. 1) in the solder resist layer 21 positioned outermost is omitted. Since the other configuration of the wiring board 10a is basically the same as that of the wiring board 10 of FIG. 1, the description thereof is omitted.

Moreover, the wiring board 10a of the present embodiment can be basically fabricated in the same manner as the process performed in the steps (FIGS. 3A to 4C) of the manufacturing method according to the aforementioned embodiment. However, the process according to the present embodiment is different in that the conductive layer (reinforcing pattern) 20A is not formed when the outermost wiring layer 20 is formed in the step of FIG. 4B. According to the present embodiment, the following advantages can be obtained in addition to the effects obtained in the aforementioned embodiment (FIGS. 1 to 4C).

Specifically, the inter-insulating layers 12, 15 and 18 are formed of an epoxy-base resin or the like as described above, and the epoxy-base resin contains a silica filler, for example, in order to increase the rigidity thereof. In contrast to this, the outermost insulating layer (solder resist layer 21) does not contain a silica filler, so that the outermost insulating layer is softer than the insulating layers 12, 15 and 18 positioned at the inner layer side. Thus, when some kind of a mechanical stress is applied from the outside of the package 10, "chipping" occurs at the portion of the solder resist layer 21, and the edge portion of the solder resist layer 21 may be separated from the main body of the board (delamination) in some cases. In this case, the side surface of the reinforcing pattern 20A covered by the solder resist layer 21 is exposed in this case. When the side surface is exposed, the inconveniences such as oxidation and corrosion occur as described above.

In this respect, the structure in which the conductor portion in the solder resist layer 21 is positioned inward from the board edge portion (specifically the structure in which the reinforcing pattern 20A is omitted) as shown in FIG. 5 is adapted. Thereby, it is made possible to cope with the aforementioned inconvenience.

Figure 6:
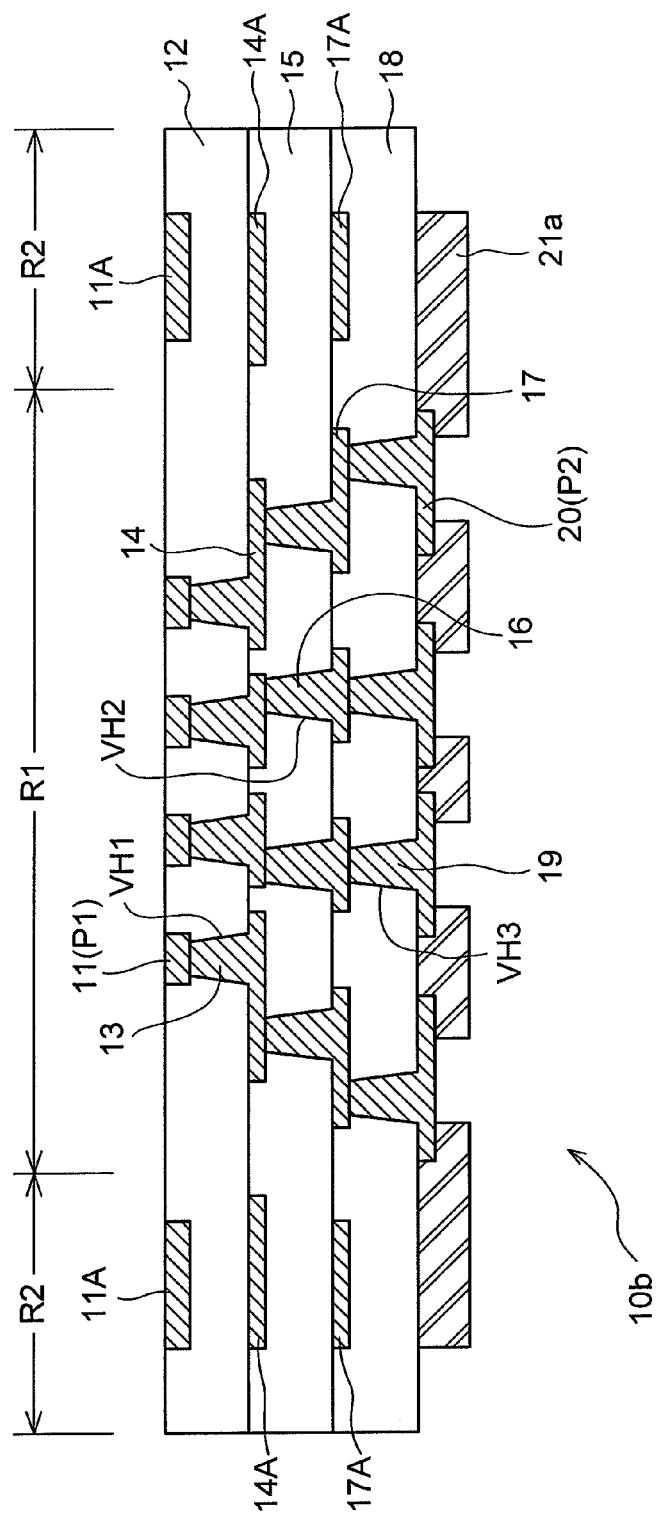
FIG. 6 is a cross-sectional view showing a configuration of a wiring board according to another modification of the embodiment of FIG. 1.

In order to cope with the aforementioned inconvenience, it is conceivable to adopt another embodiment. FIG. 6 shows an example (another modification of the embodiment of FIG. 1) of this embodiment.

In comparison with the configuration of the wiring board 10 of FIG. 1, a wiring board (semiconductor package) 10b according to the embodiment shown in FIG. 6 is different in that the reinforcing pattern 20A (see FIG. 1) is omitted in a solder resist layer 21a positioned outermost, and that the solder resist layer 21a is formed in order that the edge portion thereof can be positioned laterally inward from the edge portion (peripheral edge of the package 10b) of the board by a predetermined distance. The "predetermined distance" is selected to be approximately 250 µm, for example. Since the other configuration of the wiring board 10b is basically the same as that of the wiring board 10 of FIG. 1, the description thereof is omitted.

Moreover, the wiring board 10b of the present embodiment can be fabricated in the same manner as the process performed in the steps (FIGS. 3A to 4C) of the manufacturing method according to the aforementioned embodiment. However, the process according to the present embodiment is different in that the conductive layer (reinforcing pattern) 20A is not formed when the outermost wiring layer 20 is formed in the step of FIG. 4B, and that, when the solder resist 21a is formed, the resist is patterned in order that the edge portion of the solder resist 21a can be positioned inward from the board edge portion by a predetermined distance. In this embodiment, the same advantageous effect as that obtained in the case of the embodiment of FIG. 5 can be brought into effect.

Figure 7:
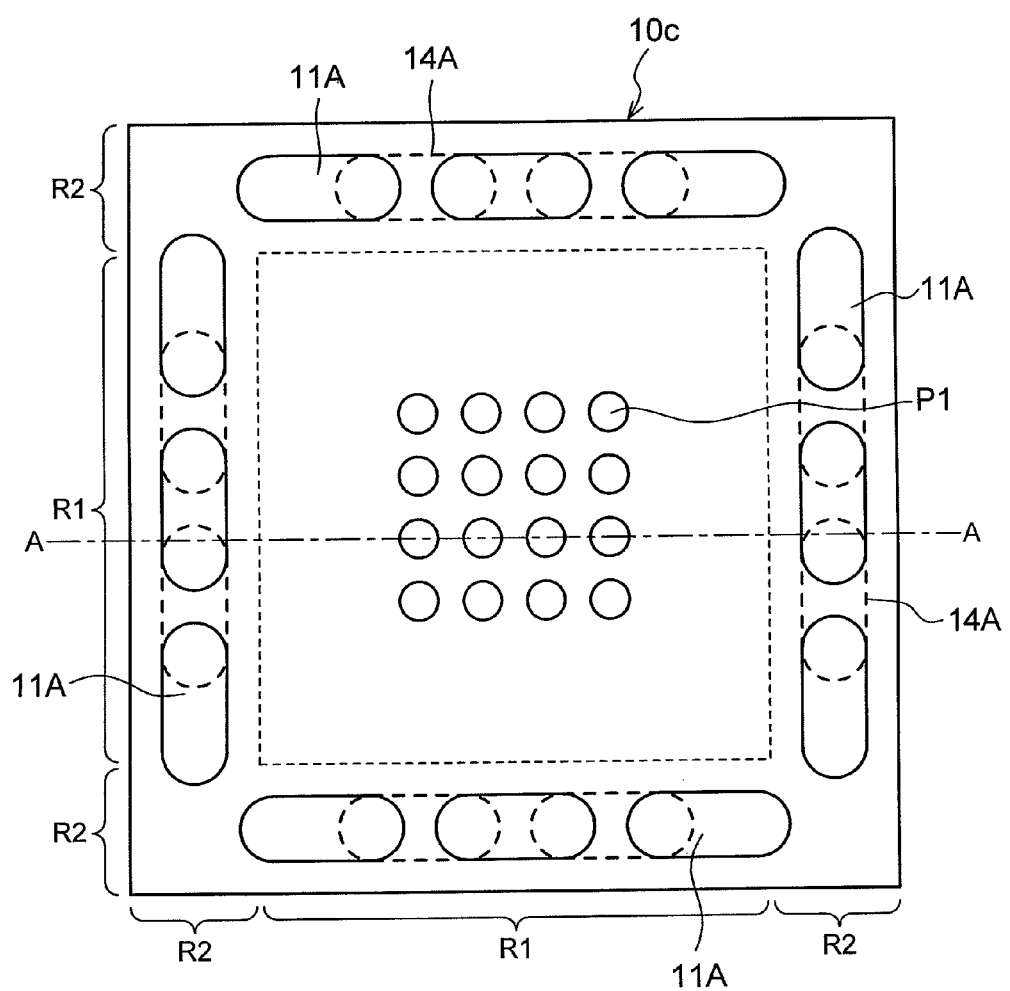
FIG. 7 is a schematic plan view of a wiring board according to still another modification of the embodiment of FIG. 1 when viewed from a chip mounting surface side.

FIG. 7 shows in a schematic plan view, the configuration of a wiring board 10c according to still another modification of the embodiment of FIG. 1 when viewed from the chip mounting surface side thereof. In the illustrated wiring board 10c, the reinforcing pattern 11A indicated by a solid line is positioned at an upper layer side, and the reinforcing pattern 14A indicated by a broken line is positioned at a lower layer side.

As shown in FIG. 7, the reinforcing pattern 14A of the lower layer is provided in a portion corresponding to the intermittent portion in the reinforcing pattern 11A of the upper layer. Specifically, it is more desirable that the end portion of the reinforcing pattern 11A and the end portion of the reinforcing pattern 14A are provided to overlap with each other when viewed in plan. Although not shown in FIG. 7, the other reinforcing patterns 17A and 20A (see FIG. 1) are provided in the same layouts as those of the reinforcing patterns 11A and 14A.

According to the wiring board 10c of the present modification, since the lower (or upper) reinforcing pattern is provided in the portion corresponding to the intermittent portion in the upper (or lower) reinforcing pattern, it is possible to improve the reinforcing effects and also to prevent a stress from concentrating on a specific portion in the wiring board 10c.

Electrode pads of a chip are connected to the pads P1 of each of the wiring boards (semiconductor packages) 10, 10a, 10b and 10c of the aforementioned embodiments via solder bumps or the like, respectively, the pads P1 being exposed from one (chip mounting surface) of the surfaces thereof.

Figure 8:
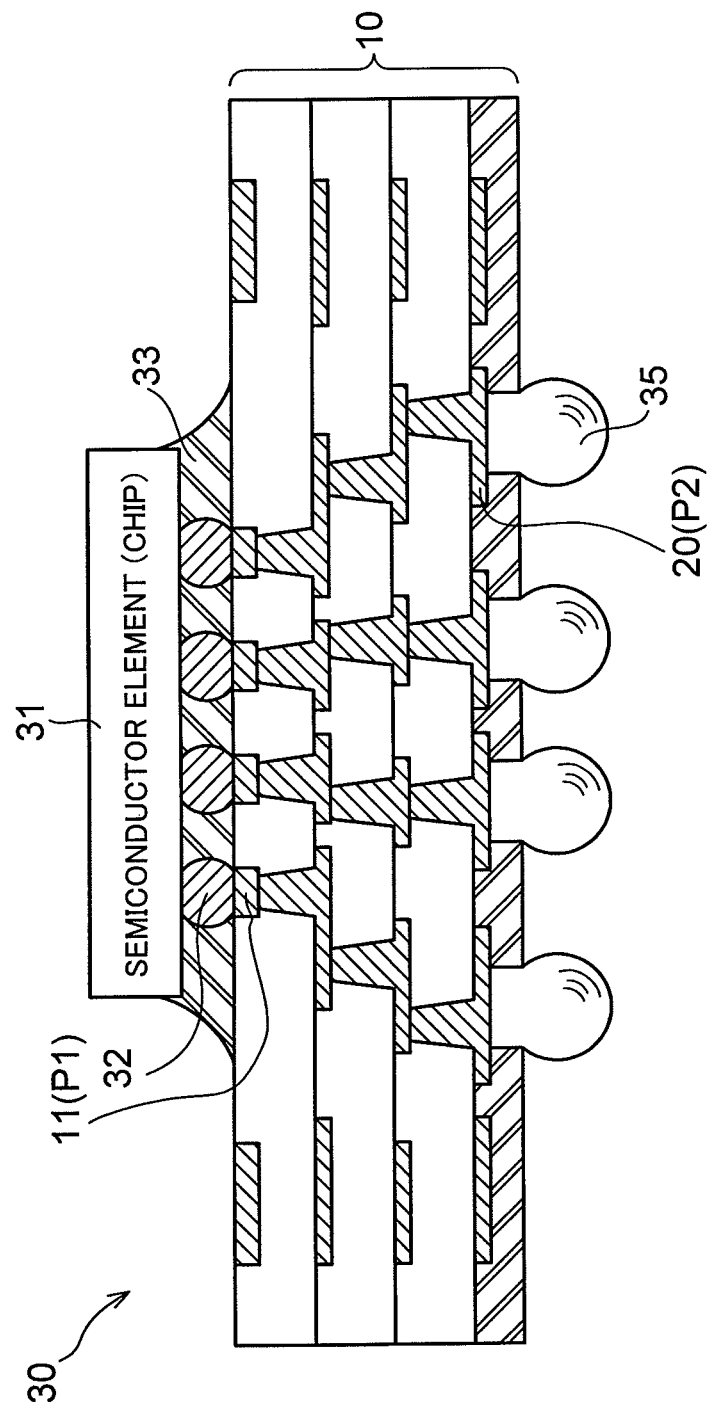
FIG. 8 is a cross-sectional view showing a state (configuration of a semiconductor device) in which a chip is mounted on the wiring board of FIG. 1.

External connection terminals such as solder balls are bonded to the pads P2 exposed from the other one (external connection terminal bonding surface) of the surfaces of each of the wiring boards 10, 10a, 10b and 10c. FIG. 8 shows a configuration example of the wiring boards.

The example in FIG. 8 shows a state in which a semiconductor element (active device chip such as a CPU, for example) 31 as an electronic component is mounted on the package 10 of FIG. 1. Specifically, the example shows a cross-sectional structure of a case where a semiconductor device 30 is configured. The electrode pads (not shown) of the chip 31 mounted thereon are flip-chip connected to the pads P1 in the chip mounting area (wiring formation region R1) via solder bumps 32, respectively. Moreover, underfill resin 33 (thermosetting epoxy-base resin or the like) is filled into the gap between the mounted chip 31 and the package 10 and then is thermally cured. Thereby, the reliability of connection between the chip 31 and the package 10 is enhanced.

Meanwhile, solder balls 35 are bonded by reflow soldering to the pads P2, respectively, on the external connection terminal bonding surface opposite to the chip mounting surface. In the illustrated example, the form of a BGA (ball grid array) in which the solder balls 35 are bonded to the pads P2, respectively, are employed. However, instead of this form, it is also possible to employ the form of a PGA (pin grid array) in which pins are bonded to the pads, respectively, or the form of an LGA (land grid array) in which the pads themselves are made to be external connection terminals.

What is claimed is:

1. A wiring board comprising:
   a wiring formation region in which a plurality of wiring layers are stacked one on top of another with insulating layers each interposed between corresponding two of the wiring layers, the wiring layers are connected to one another through a via formed in each of the insulating layers; and
   a peripheral region around the wiring formation region, in which a first reinforcing pattern and a second reinforcing pattern are respectively provided on the same levels as the outermost wiring layer and the wiring layer positioned at an inner layer side among the wiring layers and in an intermittent ring-like shape when viewed in a planar view,
   wherein one exterior surface on a front surface of the wiring board and another exterior surface on a back surface of the wiring board are provided,
   wherein a semiconductor chip mounting area is provided on the one exterior surface of the wiring formation region, a plurality of first pad portions are provided on the semiconductor chip mounting area, and the another exterior surface is electrically connectible,
   wherein one of the plurality of first pad portions is defined at a required position of the outermost wiring layer,
   wherein the plurality of first pad portions and the first reinforcing pattern are buried in the insulating layer positioned outermost on the one exterior surface side, a front surface of each of the plurality of first pad portions and a front surface of the first reinforcing pattern are exposed and flush with a surface of the insulating layer positioned outermost on the one exterior surface side, side and back surfaces of each of the plurality of first pad portions are covered with the insulating layer, and the back surface of each of the plurality of first pad portions is connected to the via of the wiring layer positioned at an inner layer side,
   wherein side and back surfaces of the first reinforcing pattern and front, side and back surfaces of the second reinforcing pattern are entirely covered with the insulating layer, and
   wherein an existence portion of the first reinforcing pattern overlaps with a non-existence portion of the second reinforcing pattern and the non-existence portion of the first reinforcing pattern overlaps with the existence portion of the second reinforcing pattern while an end portion of the existence portion of the first reinforcing pattern overlaps with an end portion of the existence portion of the second reinforcing pattern.

2. The wiring board according to claim 1, wherein the reinforcing pattern is formed of a conductive layer formed on the same level where the corresponding one of the wiring layers is provided.

3. The wiring board according to claim 2, further comprising a solder resist formed to expose a second pad portion defined at a required position in an outermost wiring layer on the another exterior surface side.

4. The wiring board according to claim 3, wherein the solder resist layer is formed in such a manner that an edge portion thereof is positioned inward from a peripheral edge of the wiring board.

5. The wiring board according to claim 1, wherein in the peripheral region a wiring layer is not provided while the first and second reinforcing patterns are provided.

6. The wiring board according to claim 1, wherein the insulating layers are made of resin and the wiring layers are made of a plated metal.

7. The wiring board according to claim 1, wherein the plurality of first pad portions and the first reinforcing pattern include gold layers at the surface thereof, respectively.

* * * * *